(12) United States Patent
Hsieh

(10) Patent No.: US 8,154,342 B2
(45) Date of Patent: Apr. 10, 2012

(54) POWER AMPLIFIER AND PROCESSING DEVICE UTILIZING THE SAME

(75) Inventor: Chung-An Hsieh, Hsinchu (TW)

(73) Assignee: UPI Semiconductor Corporation, Zhubei, Hsinchu County (TW)

( * ) Notice: Subject to any disclaimer, the term of this patent is extended or adjusted under 35 U.S.C. 154(b) by 0 days.

(21) Appl. No.: 12/852,952

(22) Filed: Aug. 9, 2010

(65) Prior Publication Data

US 2011/0304396 A1 Dec. 15, 2011

(30) Foreign Application Priority Data

Jun. 14, 2010 (TW) .................................. 99119274 A

(51) Int. Cl.
*H03F 3/217* (2006.01)

(52) U.S. Cl. ..................................... 330/251; 330/207 A
(58) Field of Classification Search .......................... None
See application file for complete search history.

(56) References Cited

U.S. PATENT DOCUMENTS

| | | | | |
|---|---|---|---|---|
| 6,781,453 B2 * | 8/2004 | Kirn | ............................. | 330/251 |
| 7,190,224 B2 * | 3/2007 | Sutardja | ....................... | 330/251 |
| 7,852,155 B2 * | 12/2010 | Chaoui | ........................ | 330/251 |

* cited by examiner

*Primary Examiner* — Khanh Nguyen
(74) *Attorney, Agent, or Firm* — Thomas|Kayden

(57) ABSTRACT

A processing device including a control unit and a power amplifier is disclosed. The control unit generates a plurality of control signals according to an input signal. The power amplifier includes a plurality of switches. The control signals control the switches to turn on or off such that a short through current does not occur in the power amplifier.

21 Claims, 7 Drawing Sheets

POWER AMPLIFIER AND PROCESSING DEVICE UTILIZING THE SAME

CROSS REFERENCE TO RELATED APPLICATIONS

This application claims priority of Taiwan Patent Application No. 099119274, filed on Jun. 14, 2010, the entirety of which is incorporated by reference herein.

BACKGROUND OF THE INVENTION

1. Field of the Invention

The invention relates to a power amplifier, and more particularly to a power amplifier, which is capable of avoiding a short through current.

2. Description of the Related Art

Highly efficient audio amplifiers are very important in mobile products. In electronic devices with high power respect the audio amplifiers. When the power of the audio amplifiers becomes large, the efficiency of the audio amplifiers becomes important. Power amplifiers comprise class A amplifiers, class B amplifiers, class C amplifiers, and class AB amplifiers according to different work points.

When a class A amplifier does not receive an input signal, current is continuously provided from an output terminal thereof. Thus, efficiency of the class A amplifier is lower than a class B amplifier, a class C amplifier, and a class AB amplifier. When a class B amplifier receives an input signal, the class B amplifier operates in a half-cycle of the input signal. In other words, when the class B amplifier does not receive an input signal, no current is provided from the output terminal of the class B amplifier. However, the class B amplifier has a crossover distortion issue. A class AB amplifier benefits from the advantages of the class A amplifier and the class B amplifier. The class AB amplifier is capable of eliminating the crossover distortion issue.

BRIEF SUMMARY OF THE INVENTION

In accordance with an embodiment, a power amplifier controlled by a control circuit generating a first control signal, a second control signal, a third control signal, a fourth control signal and a fifth control signal, comprises a first switch, a second switch, a third switch, a fourth switch and a fifth switch. The first switch is coupled between a first supply voltage and a first node and controlled by the first control signal. The first switch is turned on during a first period and a second period. The second switch is coupled between the first node and a second supply voltage and controlled by the second control signal. The second switch is turned off during the first and the second periods. The third switch is coupled between the first supply voltage and a second node and controlled by the third control signal. The third switch is turned off during the first and the second periods. The fourth switch is coupled between the second node and the second supply voltage and controlled by the fourth control signal. The fourth switch is turned on during the first period and is turned off during the second period. The fifth switch is coupled between the first and the second nodes and controlled by the fifth control signal. The fifth switch generates a short path between the first and the second nodes during the second period.

In accordance with another embodiment, a processing device comprises a control unit and a power amplifier. The control unit generates a first control signal, a second control signal, a third control signal, a fourth control signal and a fifth control signal according to an input signal. The power amplifier is coupled to the control unit and comprises a first switch, a second switch, a third switch, a fourth switch and a fifth switch. The first switch is coupled between a first supply voltage and a first node and controlled by the first control signal. The first switch is turned on during a first period and a second period. The second switch is coupled between the first node and a second supply voltage and controlled by the second control signal. The second switch is turned off during the first and the second periods. The third switch is coupled between the first supply voltage and a second node and controlled by the third control signal. The third switch is turned off during the first and the second periods. The fourth switch is coupled between the second node and the second supply voltage and controlled by the fourth control signal. The fourth switch is turned on during the first period and is turned off during the second period. The fifth switch is coupled between the first and the second nodes and controlled by the fifth control signal. The fifth switch generates a short path between the first and the second nodes during the second period.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
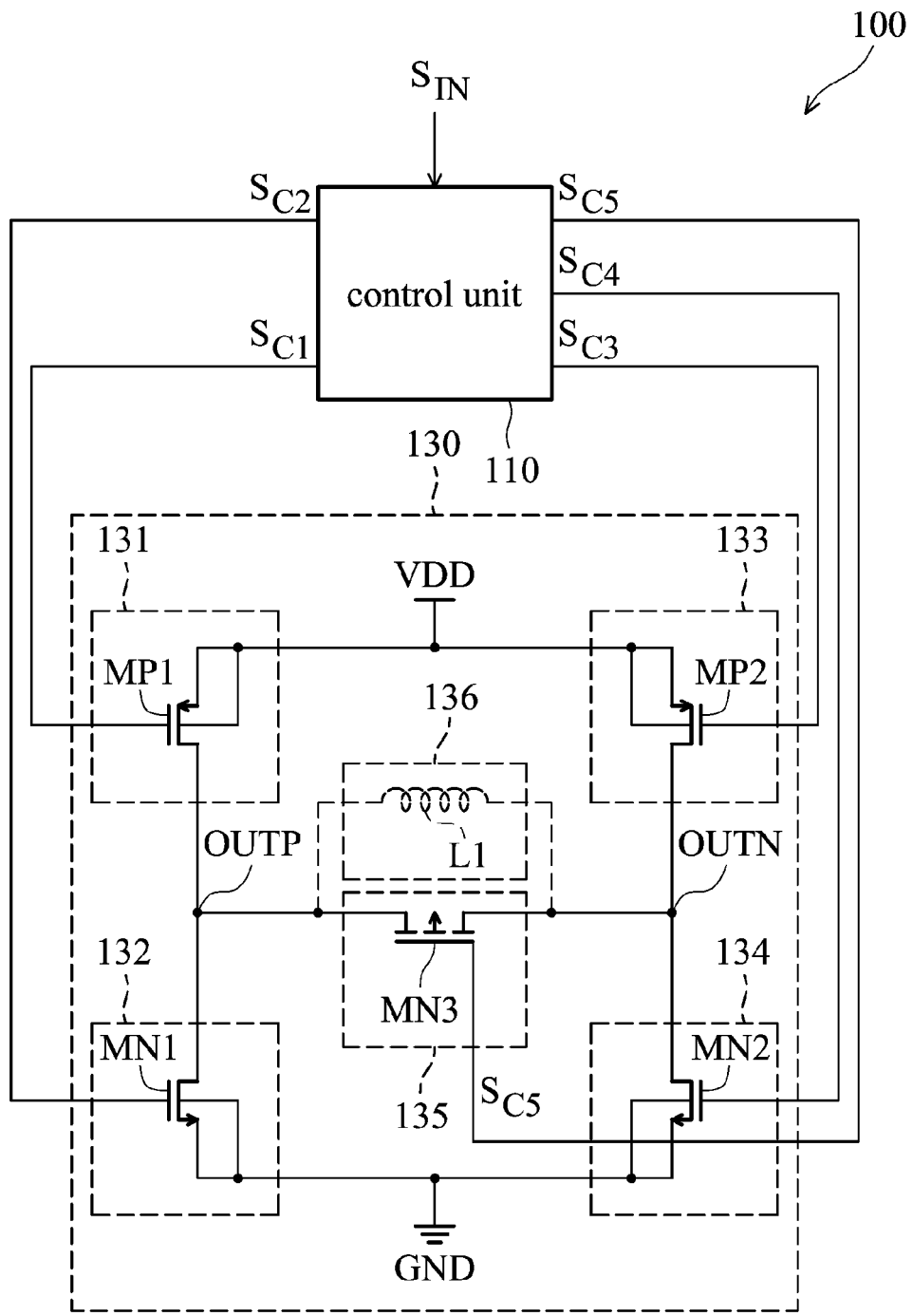
FIG. 1 is a schematic diagram of an exemplary embodiment of a processing device.

FIG. 1 is a schematic diagram of an exemplary embodiment of a processing device. The processing device 100 comprises a control unit 110 and a power amplifier 130. The control unit 110 generates control signals $S_{C1}$-$S_{C5}$ according to an input signal $S_{IN}$. In one embodiment, the control unit 110 is a pulse width modulation (PWM). The power amplifier 130 is coupled to the control unit. In one embodiment, the power amplifier 130 amplifies an audio signal. In this embodiment, the power amplifier 130 comprises switches 131-135.

The switch 131 is coupled between a supply voltage VDD and a node OUTP and controlled by the control signal $S_{C1}$. In this embodiment, the switch 131 is turned on during a first period and a second period. The invention does not limit the kind of switch 131 implemented. In this embodiment, the switch 131 is a P-type transistor MP1. For example, the P-type transistor MP1 is turned on when the control signal $S_{C1}$ is at a low level. The P-type transistor MP1 is turned off when the control signal $S_{C1}$ is at a high level.

The switch 132 is coupled between the node OUTP and a supply voltage GND and controlled by the control signal $S_{C2}$. In this embodiment, the switch 132 is turned off during the first and the second periods. Furthermore, the supply voltage VDD is higher than the supply voltage GND in this embodiment.

The invention does not limit the kind of switch 132 implemented. In one embodiment, the switch 132 is an N-type transistor MN1. For example, the N-type transistor MN1 is turned on when the control signal $S_{C2}$ is at a high level. The N-type transistor MN1 is turned off when the control signal $S_{C2}$ is at a low level.

The switch 133 is coupled between the supply voltage VDD and a node OUTN and controlled by the control signal $S_{C3}$. In this embodiment, the switch 133 is turned off during the first and the second periods. The invention does not limit the kind of switch 133 implemented. In this embodiment, the switch 133 is a P-type transistor MP2. For example, the P-type transistor MP2 is turned on when the control signal $S_{C3}$ is at a low level. The P-type transistor MP2 is turned off when the control signal $S_{C3}$ is at a high level.

The switch 134 is coupled between the node OUTN and the supply voltage GND and controlled by the control signal $S_{C4}$. In this embodiment, the switch 134 is turned on during the first period and turned off during the second period. The invention does not limit the kind of switch 134 implemented. In this embodiment, the switch 134 is an N-type transistor MN2. When the control signal $S_{C4}$ is a high level, the N-type transistor MN2 is turned on. When the control signal $S_{C4}$ is at a low level, the N-type transistor MN2 is turned off.

The switch 135 is coupled between the nodes OUTP and OUTN and controlled by the control signal $S_{C5}$. In this embodiment, the switch 135 generates a short path between the first and the second nodes during the second period. The invention does not limit the kind of switch 135 implemented. In this embodiment, the switch 135 is an N-type transistor MN3. In other embodiments, the switch 135 is a P-type transistor.

For example, when the control signal $S_{C5}$ is at a high level, the N-type transistor MN3 is turned on. Thus, a short path is formed between the first and the second nodes. When the control signal $S_{C5}$ is at a low level, the N-type transistor MN3 is turned off.

In this embodiment, the processing device 100 further comprises a speaker unit 136. The speaker unit 136 is coupled between the nodes OUTP and OUTN. As shown in FIG. 1, the speaker unit 136 is equivalent to a inductor L1. The processing device 100 generates the control signals $S_{C1}$-$S_{C5}$ according to the input signal $S_{IN}$ such that the power amplifier 130 drives the speaker unit 136 to send corresponding audio.

Figure 2A:
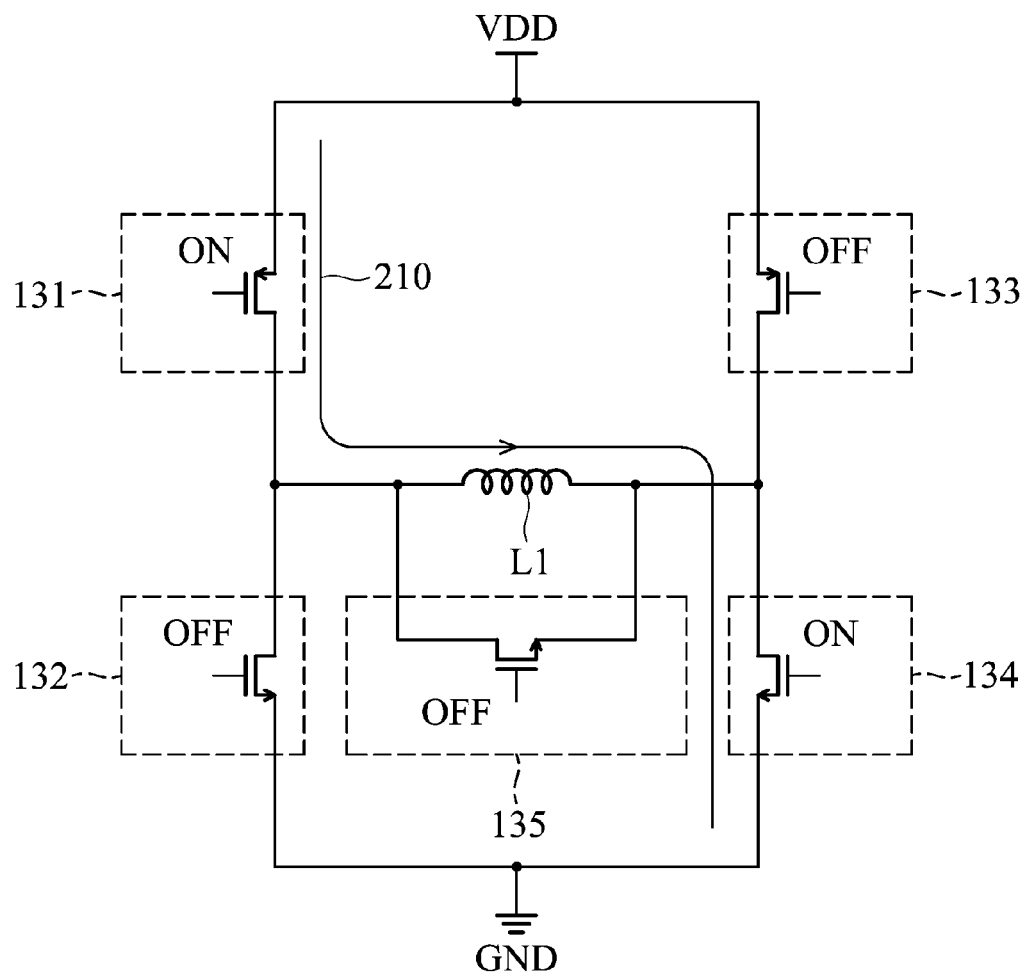
FIGS. 2A-2C and 3A-3C show states of switches of the power amplifier.
Figure 2B:
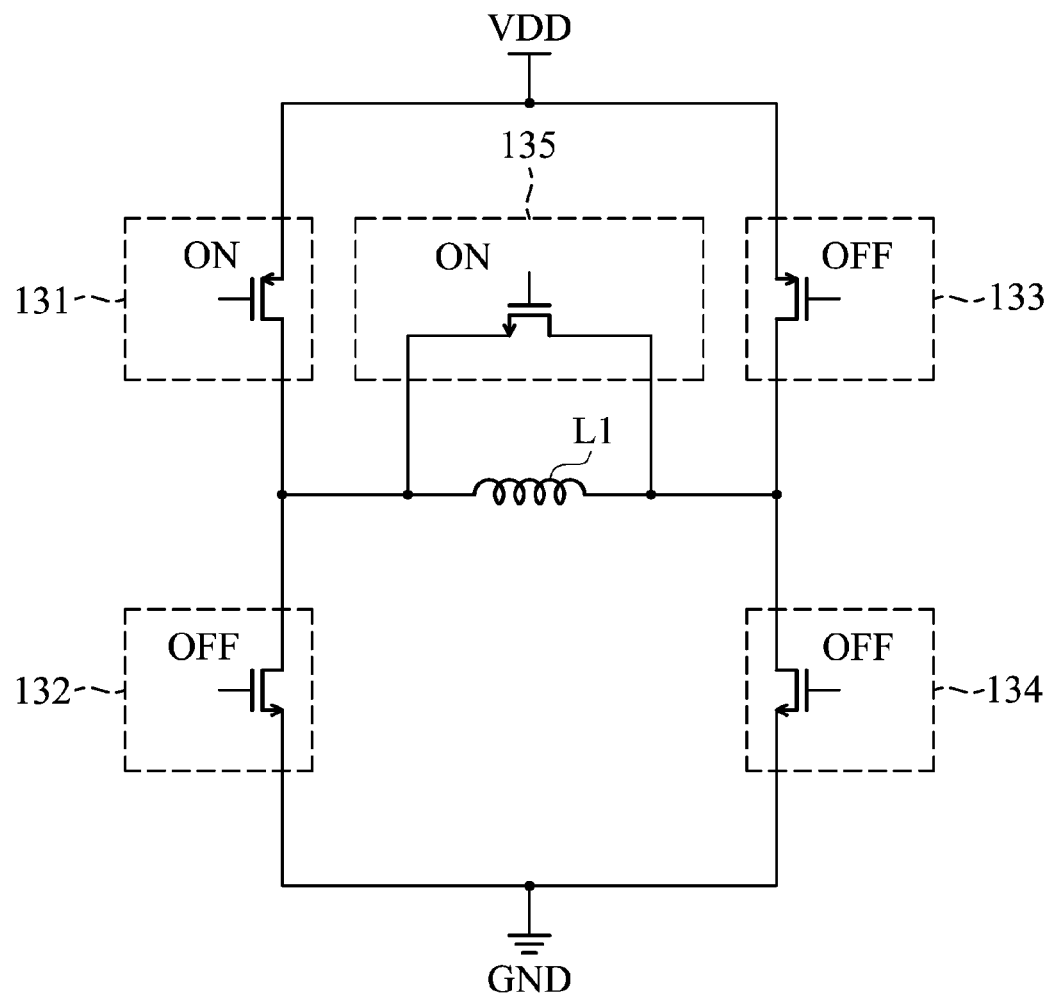

During the first period, the switches 131 and 134 are turned on and the switches 132, 133 and 135 are turned off. As shown in FIG. 2A, the switch 131, the inductor L1 and the switch 134 constitute a current path 210.

During the second period following the first period, the switch 131 is continuously turned on and the switches 132 and 133 are continuously turned off. At this time, the switch 134 is turned off. In this embodiment, the switch 134 is switched from a turned-on state into a turned-off state. Meanwhile, the switch 135 is switched from a turned-off stage into a turned-on stage. Since the switch 135 is turned on, a short path is formed between the nodes OUTP and OUTN.

Figure 2C:
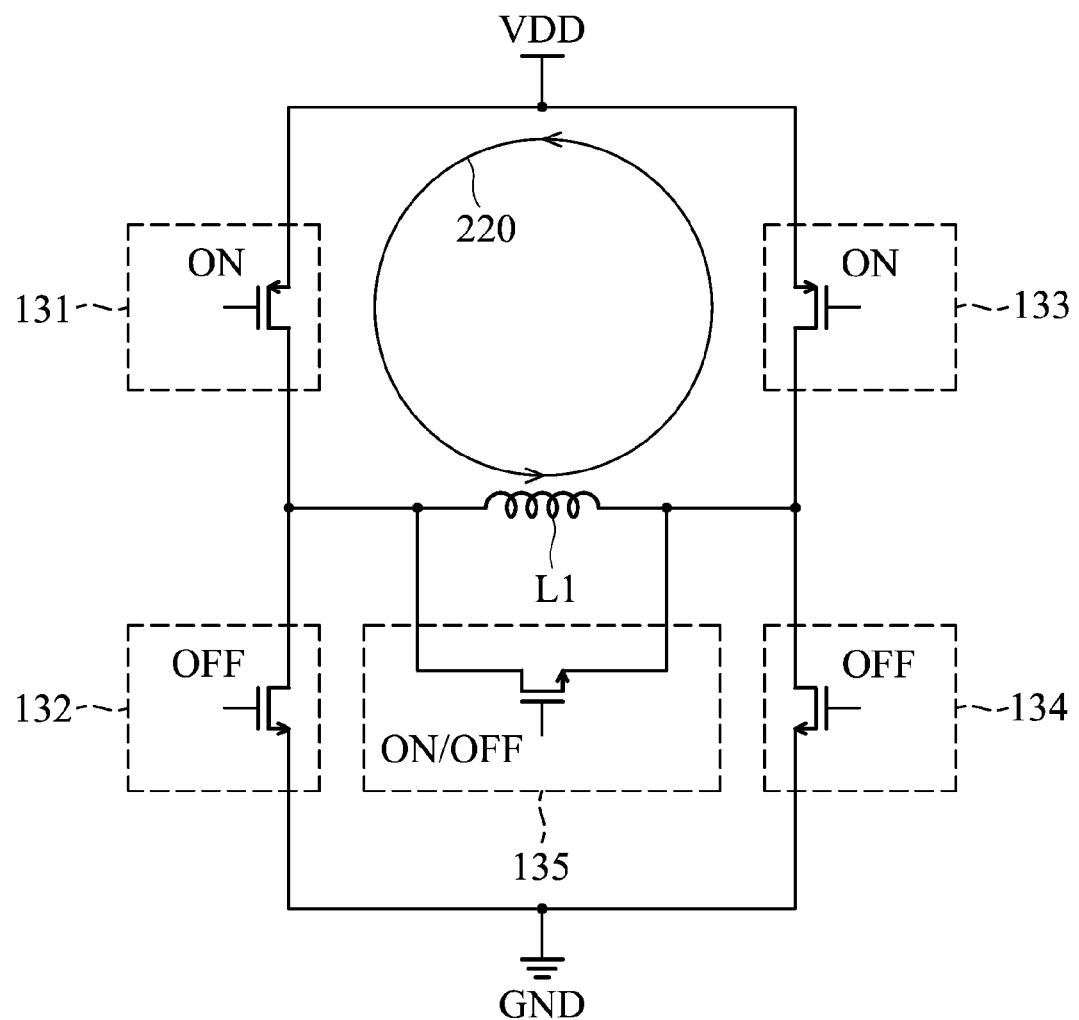

During the third period following the second period, the switch 131 is continuously turned on and the switches 132 and 134 are continuously turned off. At this time, the switch 133 is turned on. As shown in FIG. 2C, the switch 131, the inductor L1 and the switch 133 constitute a current path 220 during the third period. At this time, the switch 135 can be turned on or off. In this embodiment, the switches 133 and 134 are not simultaneously turned on during the second period to avoid a short through current.

Figure 3A:
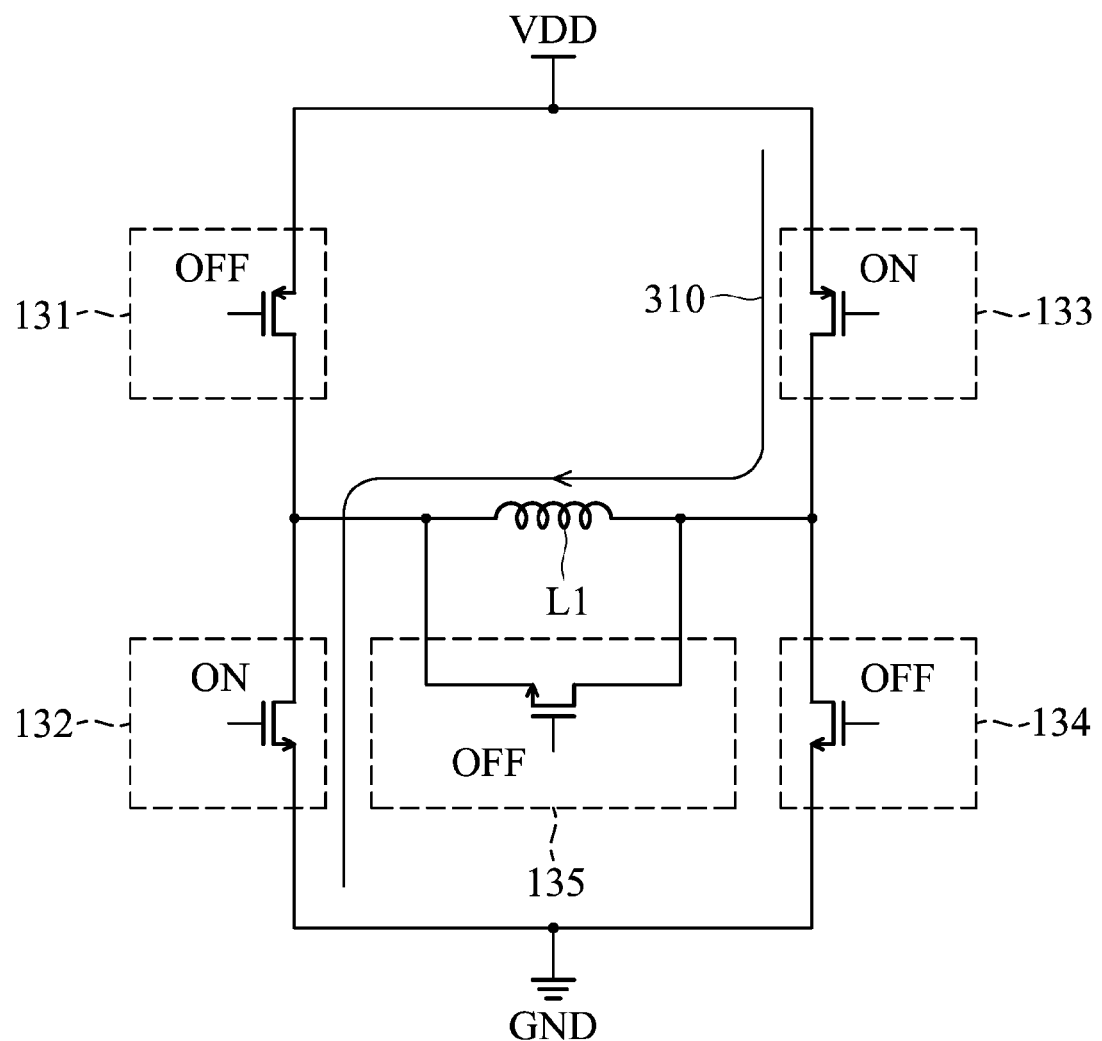

During a fourth period follow in the third period, the switches 131, 134 and 135 are turned off and the switches 132 and 133 are turned on. As shown in FIG. 3A, the switch 133, the inductor L1 and the switch 132 constitute a current path 310.

Figure 3B:
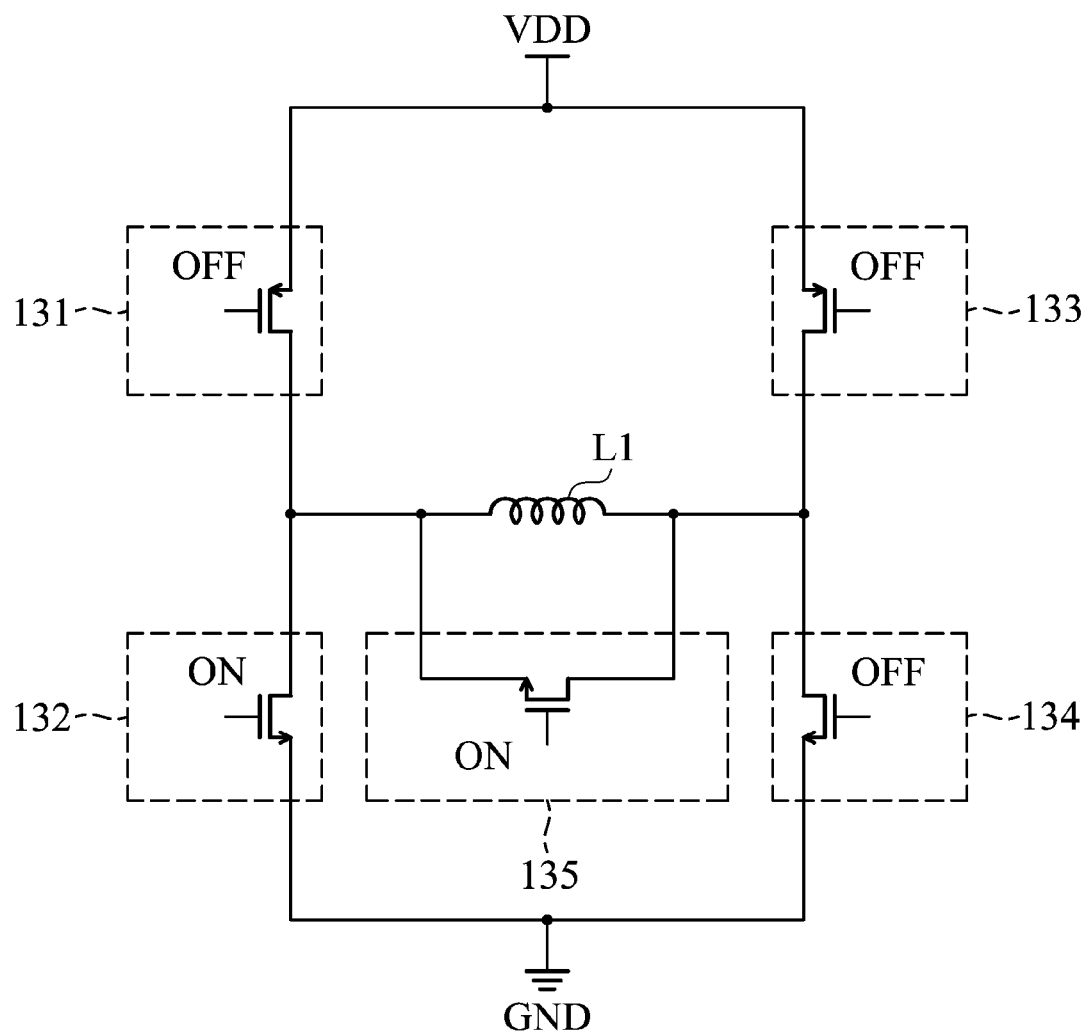

During a fifth period follow in the fourth period, the switches 131 and 134 are continuously turned off and the switch 132 is continuously turned on. At this time, the switch 133 is turned off and the switch 135 is turned on as shown in FIG. 3B. In this embodiment, the switch 133 is switched from a turned-on state into a turned-off state. Meanwhile, the switch 135 is switched from a turned-off state into a turned-on state. Since the switch 135 is turned on, a short path is formed between the nodes OUTP and OUTN.

Figure 3C:
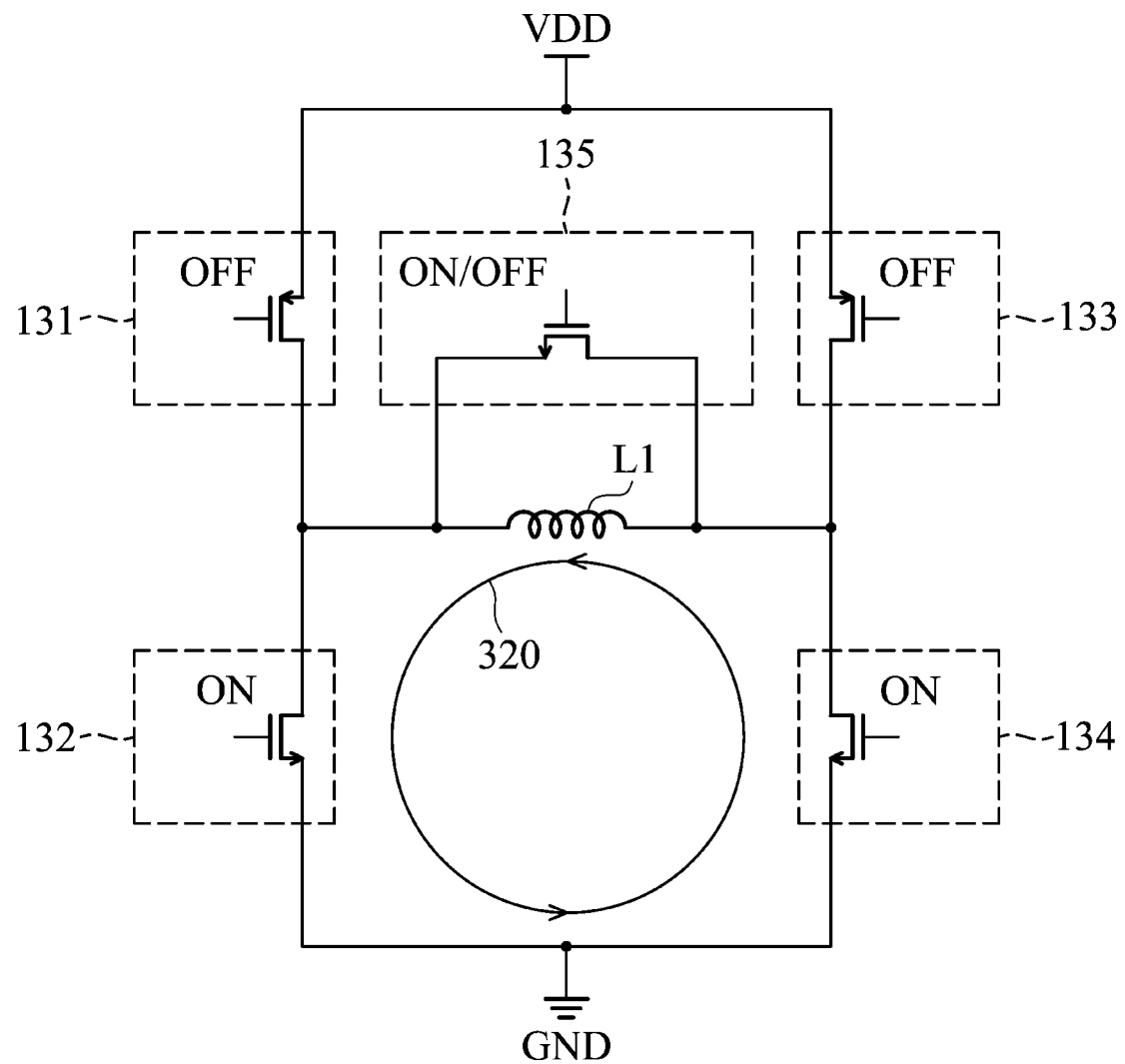

During a sixth period follow in the fifth period, the switches 131 and 133 are continuously turned off and the switch 132 is continuously turned on. At this time, the switch 134 is turned on. As shown in FIG. 3C, the switch 134, the inductor L1 and the switch 132 constitute a current path 320 during the sixth period. At this time, the switch 135 can be turned on or off.

In this embodiment, the switches 133 and 134 are simultaneously turned off to avoid a short through current passing through the switches 133 and 134 during the fifth period.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power amplifier controlled by a control circuit generating a first control signal, a second control signal, a third control signal, a fourth control signal and a fifth control signal, comprising:
   a first switch coupled between a first supply voltage and a first node and controlled by the first control signal, wherein the first switch is turned on during a first period and a second period;
   a second switch coupled between the first node and a second supply voltage and controlled by the second control signal, wherein the second switch is turned off during the first and the second periods;
   a third switch coupled between the first supply voltage and a second node and controlled by the third control signal, wherein the third switch is turned off during the first and the second periods;
   a fourth switch coupled between the second node and the second supply voltage and controlled by the fourth control signal, wherein the fourth switch is turned on during the first period and is turned off during the second period; and
   a fifth switch coupled between the first and the second nodes and controlled by the fifth control signal, wherein the fifth switch generates a short path between the first and the second nodes during the second period.

2. The power amplifier as claimed in claim 1, wherein the fourth switch is turned off during the second period, and simultaneously, the fifth switch is turned on during the second period.

3. The power amplifier as claimed in claim 1, wherein the first and the third switches are turned on during a third period, and the second and the fourth switches are turned off during the third period.

4. The power amplifier as claimed in claim 3, wherein the fifth switch is turned off during the first period and the fifth switch is turned on during the third period.

5. The power amplifier as claimed in claim 3, wherein the fifth switch is turned off during the first and the third periods.

6. The power amplifier as claimed in claim 5, wherein:
the first, the fourth and the fifth switches are turned off during a fourth period, and the second and the third switches are turned on during the fourth period;
the first, the third and the fourth switches are turned off during a fifth period and the second and the fifth switches are turned on during the fifth period; and
the first and the third switches are turned off during a sixth period and the second and the fourth switches are turned on.

7. The power amplifier as claimed in claim 6, wherein the fifth switch is turned on during the sixth period.

8. The power amplifier as claimed in claim 4, wherein:
the first, the fourth and the fifth switches are turned off during a fourth period, and the second and the third switches are turned on during the fourth period
the first, the third and the fourth switches are turned off during a fifth period and the second and the fifth switches are turned on during the fifth period; and
the first and the third switches are turned off during a sixth period and the second and the fourth switches are turned on.

9. The power amplifier as claimed in claim 8, wherein the fifth switch is turned off during the sixth period.

10. The power amplifier as claimed in claim 1, wherein the fifth switch is a transistor.

11. A processing device comprising:
a control unit generating a first control signal, a second control signal, a third control signal, a fourth control signal and a fifth control signal according to an input signal;
a power amplifier coupled to the control unit and comprising:
a first switch coupled between a first supply voltage and a first node and controlled by the first control signal, wherein the first switch is turned on during a first period and a second period;
a second switch coupled between the first node and a second supply voltage and controlled by the second control signal, wherein the second switch is turned off during the first and the second periods;
a third switch coupled between the first supply voltage and a second node and controlled by the third control signal, wherein the third switch is turned off during the first and the second period;
a fourth switch coupled between the second node and the second supply voltage and controlled by the fourth control signal, wherein the fourth switch is turned on during the first period and is turned off during the second period; and
a fifth switch coupled between the first and the second nodes and controlled by the fifth control signal, wherein the fifth switch generates a short path between the first and the second nodes during the second period.

12. The processing device as claimed in claim 11, further comprising:
a speaker unit coupled between the first and the second nodes.

13. The processing device as claimed in claim 11, wherein the fourth switch is turned off during the second period, and simultaneously, the fifth switch is turned on during the second period.

14. The processing device as claimed in claim 11, wherein the first and the third switches are turned on during a third period, and the second and the fourth switches are turned off during the third period.

15. The processing device as claimed in claim 14, wherein the fifth switch is turned off during the first period and the fifth switch is turned on during the third period.

16. The processing device as claimed in claim 14, wherein the fifth switch is turned off during the first and the third periods.

17. The processing device as claimed in claim 16, wherein:
the first, the fourth and the fifth switches are turned off during a fourth period, and the second and the third switches are turned on during the fourth period;
the first, the third and the fourth switches are turned off during a fifth period and the second and the fifth switches are turned on during the fifth period; and
the first and the third switches are turned off during a sixth period and the second and the fourth switches are turned on during the sixth period.

18. The processing device as claimed in claim 17, wherein the fifth switch is turned on during the sixth period.

19. The processing device as claimed in claim 15, wherein:
the first, the fourth and the fifth switches are turned off during a fourth period, and the second and the third switches are turned on during the fourth period;
the first, the third and the fourth switches are turned off during a fifth period and the second and the fifth switches are turned on during the fifth period; and
the first and the third switches are turned off during a sixth period and the second and the fourth switches are turned on during the sixth period.

20. The processing device as claimed in claim 19, wherein the fifth switch is turned off during the sixth period.

21. The processing device as claimed in claim 11, wherein the fifth switch is a transistor.

* * * * *